(12) United States Patent
Ramaraju et al.

(10) Patent No.: US 7,215,188 B2
(45) Date of Patent: May 8, 2007

(54) INTEGRATED CIRCUIT HAVING A LOW POWER MODE AND METHOD THEREFOR

(75) Inventors: Ravindraraj Ramaraju, Round Rock, TX (US); David R. Bearden, Austin, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 11/065,796

(22) Filed: Feb. 25, 2005

(65) Prior Publication Data

US 2006/0192596 A1    Aug. 31, 2006

(51) Int. Cl.
G05F 3/02 (2006.01)
(52) U.S. Cl. .................. 327/544; 327/333; 326/60; 326/62
(58) Field of Classification Search ............. 327/544, 327/333
See application file for complete search history.

(56) References Cited

U.S. PATENT DOCUMENTS

| | | | | |
|---|---|---|---|---|
| 5,410,507 | A * | 4/1995 | Tazunoki et al. | 365/189.09 |
| 6,433,586 | B2 * | 8/2002 | Ooishi | 326/93 |
| 6,597,620 | B1 | 7/2003 | McMinn | 702/186 |
| 6,643,208 | B2 * | 11/2003 | Yamagata et al. | 365/226 |
| 6,724,648 | B2 | 4/2004 | Khellah et al. | 365/154 |
| 2002/0171461 | A1 * | 11/2002 | Yamazaki et al. | 327/143 |
| 2003/0188241 | A1 | 10/2003 | Zyuban et al. | 714/726 |
| 2004/0008071 | A1 | 1/2004 | Ko et al. | 327/365 |
| 2004/0061135 | A1 | 4/2004 | Ikeno et al. | 257/200 |
| 2004/0075478 | A1 | 4/2004 | Correale, Jr. et al. | 327/202 |
| 2004/0143769 | A1 | 7/2004 | Deng et al. | 713/300 |
| 2004/0178493 | A1 | 9/2004 | Correale, Jr. | 257/691 |
| 2005/0218952 | A1 * | 10/2005 | Padhye et al. | 327/218 |
| 2005/0253462 | A1 * | 11/2005 | Falkowski et al. | 307/43 |

OTHER PUBLICATIONS

Correale, Jr., Anthony; "'Watts' the Matter: Power Reduction Issues; IEEE; 2001; p. 9; #0-7803-7024-4/01; IEEE, USA.
Lackey, David E. et al.; "Managing Power and Performance for System-on-Chip Designs using Voltage Islands"; IEEE; 2002; pp. 195-202; #0-7803-7607-2/02; IEEE, USA.

(Continued)

Primary Examiner—Tuan T. Lam
Assistant Examiner—Hiep Nguyen
(74) Attorney, Agent, or Firm—Daniel D. Hill (57) ABSTRACT

An integrated circuit (70) includes a first power supply bus (72) and a second power supply bus (74). The first power supply bus (72) provides a first power supply voltage (VDD) to a first plurality of circuit elements (12 and 76). The second power supply bus (74) provides a second power supply voltage (LVDD) to a second plurality of circuit elements (14), where the second power supply voltage is lower than the first power supply voltage. During a normal operating mode of the integrated circuit (70), the first power supply bus (72) provides the first power supply voltage to the first plurality of circuit elements (12 and 76) and the second power supply voltage is not provided to the second plurality of circuit elements (14). During a low power operating mode, the second power supply bus (74) provides the second power supply voltage to the second plurality of circuit elements (14) and the first power supply voltage is not provided to the first plurality of circuit elements (12 and 76).

20 Claims, 3 Drawing Sheets

OTHER PUBLICATIONS

Zyuban, Victor et al.; "Low Power Integrated Scan-Retention Mechanism"; ISLPED '02, Monterey, CA; Aug, 12-14, 2002; pp. 98-102; ACM; #1-58113-475-04/02/0008; ACM, USA.

Carballo, Juan-Antonio et al.; "A Semi-Custom Voltage-Island Technique and Its Application to High-Speed Serial Links"; ISLPED '03 Seoul, Korea; Aug. 25-27, 2003; pp. 60-65; #1-58113-682-X/03/0008; ACM; USA.

* cited by examiner

INTEGRATED CIRCUIT HAVING A LOW POWER MODE AND METHOD THEREFOR

RELATED APPLICATION

A related, copending application Ser. No. 11/065,793 is entitled "Integrated Circuit Storage Element Having Low Power Data Retention and Method Therefor", by Ramaraju et al., is assigned to the assignee hereof, and filed concurrently herewith.

FIELD OF THE INVENTION

This invention relates generally to integrated circuits, and more particularly to an integrated circuit having a low power mode and a method therefor.

RELATED ART

Integrated circuits are being manufactured with increasingly more transistors. As the transistor count goes up, static leakage power also increases. One way to reduce the static leakage power is to operate the integrated circuit with a lower power supply voltage. Another way to reduce the static leakage power is to manufacture the integrated circuit with relatively higher threshold voltages. However, both of these techniques may lower the operating speed of the integrated circuit.

Integrated circuits are commonly designed having a lower power, or idle mode, of operation to reduce static power consumption during times of little or no activity. It may be important to retain the logic state of certain storage elements so that the integrated circuit can be returned to a normal operating mode without loss of information. One technique that has been used to accomplish this is to store the information in a separate memory array before entering the low power mode. This can be complex to implement when there is a large amount of information. Another technique is to remove the power supply from portions of the integrated circuit while leaving other portions powered up. This reduces some leakage power but not all.

Therefore, it would be desirable to further reduce static power consumption during a low power mode of operation while maintaining transistor switching speed during a normal mode of operation.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Generally, in one embodiment, the present invention provides an integrated circuit having a first power supply bus and a second power supply bus. The first power supply bus provides a first power supply voltage (VDD) to a first plurality of circuit elements. The second power supply bus provides a second power supply voltage (LVDD) to a second plurality of circuit elements, where the second power supply voltage is lower than the first power supply voltage. During a normal operating mode of the integrated circuit, the first power supply bus provides the first power supply voltage to the first plurality of circuit elements and the second power supply voltage is not provided to the second plurality of circuit elements. During a low power operating mode, the second power supply bus provides the second power supply voltage to the second plurality of circuit elements and the first power supply voltage is not provided to the first plurality of circuit elements. By operating the integrated circuit with two power supply voltages as described herein, an integrated circuit can have high speed operation during a normal operating mode while also having relatively lower static power consumption during a low power operating mode.

Figure 1:
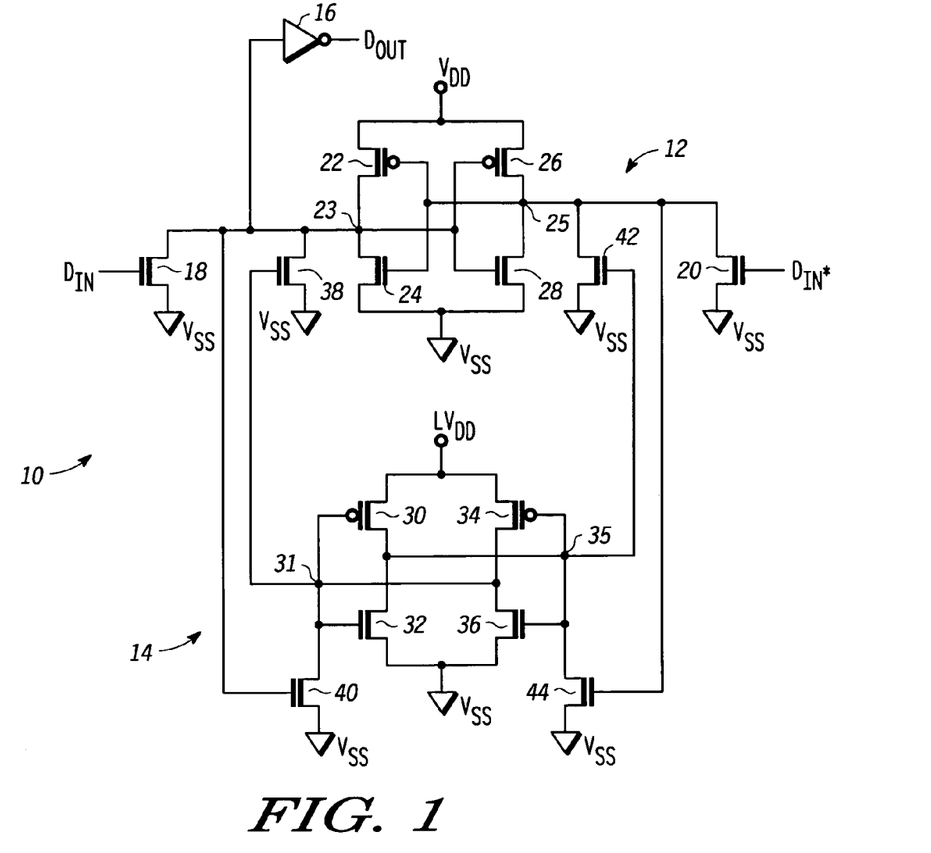
FIG. 1 illustrates, in schematic diagram form, an integrated circuit storage element in accordance with one embodiment of the present invention.

FIG. 1 illustrates, in schematic diagram form, an integrated circuit storage element 10 in accordance with one embodiment of the present invention. Integrated circuit storage element 10 is preferably implemented on an integrated circuit using complementary metal oxide semiconductor (CMOS) transistors. However, in other embodiments, the storage element 10 may be implemented using different types of transistors. Storage element 10 includes latches 12 and 14, inverter 16, and N-channel transistors 18, 20, 38, 40, 42, and 44. Latch 12 includes P-channel transistors 22 and 26 and N-channel transistors 24 and 28. Latch 14 includes P-channel transistors 30 and 34 and N-channel transistors 32 and 36.

In one embodiment, as illustrated in FIG. 1, latches 12 and 14 each comprise a pair of cross-coupled inverters. Transistors 22 and 24 are connected together to form one inverter in latch 12, and transistors 26 and 28 are connected together to form the other inverter. Likewise, transistors 30 and 32 are connected together to form one inverter in latch 14, and transistors 34 and 36 are connected together to form the other inverter. Nodes 23 and 25 form both I/O terminals and storage nodes for latch 12, and nodes 31 and 35 form both I/O terminals and storage nodes for latch 14. Latch 12 has a power supply voltage terminal labeled "$V_{DD}$" for receiving a first power supply voltage. Latch 14 has a power supply voltage terminal labeled "$LV_{DD}$" for receiving a second power supply voltage, where the second power supply voltage is lower than the first power supply voltage. For example, $V_{DD}$ may be about 1.2 volts and $LV_{DD}$ may be about 0.6 volts. In other embodiments, the power supply voltages may be different. Also, in the illustrated embodiment, the power supply voltages $V_{DD}$ and $LV_{DD}$ are both provided from a source external to the integrated circuit. However, in other embodiments, one skilled in the art will recognize that the two power supply voltages $V_{DD}$ and $LV_{DD}$ may be derived from a single external source and stepped up or down, as desired on the integrated circuit.

N-channel transistor 18 has a drain (current electrode) connected to node 23, a source (current electrode) connected to ground ($V_{SS}$), and a gate (control electrode) connected to receive an input data signal labeled "$D_{IN}$". N-channel transistor 20 has a drain connected to node 25, a source connected to $V_{SS}$, and a gate connected to receive an input data signal labeled "$D_{IN}*$". Note that the asterisk (*) after the signal name indicates that the signal is a logical complement of a signal having the same name but lacking the asterisk.

N-channel transistor 38 has a drain connected to node 23, a source connected to VSS, and a gate connected to node 31 of latch 14. N-channel transistor 42 has a drain connected to node 25, a source connected to $V_{SS}$, and a gate connected to node 35 of latch 14. N-channel transistor 40 has a drain connected to node 31, a gate connected to node 23, and a source connected to $V_{SS}$. N-channel transistor 44 has a drain connected to node 35, a gate connected node 25, and a source connected to $V_{SS}$. Note that in the illustrated embodiment, $V_{SS}$ is at zero volts, or ground. In other embodiments, $V_{SS}$ may be at a different potential.

Figure 2:
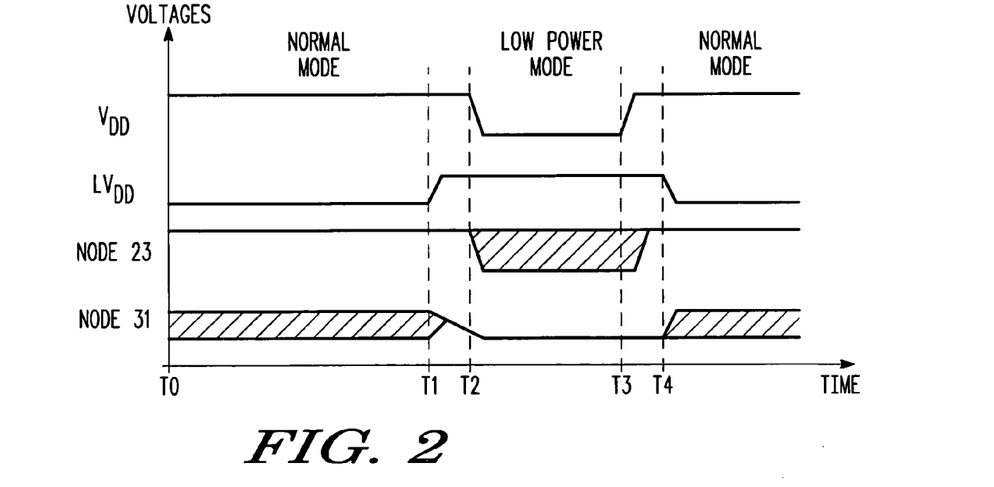
FIG. 2 illustrates a timing diagram of various voltages in the integrated circuit storage element of FIG. 1.

FIG. 2 illustrates a timing diagram of various voltages in the integrated circuit storage element 10 of FIG. 1. The operation of integrated circuit storage element 10 will be described with reference to both FIG. 1 and FIG. 2.

In operation, when integrated circuit storage element 10 is operating in a normal mode of operation, as illustrated in FIG. 2 between times T0 and T1, latch 12 operates in a conventional manner. $V_{DD}$ is provided to latch 12 at the normal operating voltage and $LV_{DD}$ is not provided to latch 14. In FIG. 2, $LV_{DD}$ is at zero volts. Differential data input signals $D_{IN}/D_{IN}*$ are provided to the gates of transistors 18 and 20. A differential logic state is stored at nodes 23 and 25 corresponding to the logic states of $D_{IN}/D_{IN}*$. Note that only the logic state on node 23 is shown in FIG. 2. however because signals $D_{IN}/D_{IN}*$ are differential, nodes 23 and 25 store opposite logic states When the voltage of node 23 is a logic high or at $V_{DD}$, the voltage of node 25 (not shown) would be at a logic low, or at zero volts. Note that differential data signals are provided in the illustrated embodiments, however, in other embodiments, a single-ended input data signal may be used. Also note that transistors 18 and 20 may not be present in other embodiments, and a data signal may be directly inputted, or received, from the nodes 23 and 25.

Between times T1 and T2, FIG. 2 illustrates transitioning from normal mode to low power mode. To transition from normal operating mode to low power operating mode, the second power supply voltage $LV_{DD}$ is first provided to latch 14 at time T1 while $V_{DD}$ is still at a normal operating voltage. While $LV_{DD}$ is being provided to latch 14 and $V_{DD}$ is provided to latch 12, data stored in the latch 12 is transferred automatically to latch 14 through transistors 40 and 44. For example, if node 23 is storing a logic high, node 25 will be at a logic low. A logic high voltage will be provided to the gate of transistor 40, causing transistor 40 to be conductive. Likewise, a logic low voltage at the gate of transistor 44 will cause transistor 44 to be substantially non-conductive. A voltage on node 31 will be reduced to about $V_{SS}$, or ground, and a voltage on node 35 (not shown in FIG. 2) will be at about $LV_{DD}$. After a predetermined length of time sufficient to allow the data to be transferred, $V_{DD}$ is removed from latch 12 at time T2, and the logic state of the data is retained in latch 14. To further reduce leakage current in the second latch during the low power mode, the transistors of the second latch may be optionally manufactured using transistors having a higher threshold voltage ($V_T$).

To transition back to the normal mode of operation, $V_{DD}$ is first reapplied to the power supply voltage terminal of latch 12 at time T3. If a logic low voltage is being stored on node 31 and a logic high voltage is stored on node 35, transistor 42 will be conductive, causing node 25 of latch 12 to be reduced to $V_{SS}$. Transistor 38 will be substantially non-conductive, allowing a voltage on node 23 to be increased to about $V_{DD}$. Latch 14 continues to receive $LV_{DD}$ while the data is automatically transferred back to latch 12. After the data is transferred from latch 14 back to latch 12, $LV_{DD}$ is removed from latch 14 after a time period sufficient to allow the data to be transferred at time T4. Preferably, a data input signal $D_{IN}/D_{IN}*$ is not present at the gates of transistors 18 and 20 during the time data is transferred from latch 14 to latch 12. Also, when transitioning back to normal mode, a ramp rate of the power supply voltage $V_{DD}$ may be controlled to make it easier for the stored logic state of nodes 31 and 35 of latch 14 to toggle nodes 23 and 25 of latch 12.

Figure 3:
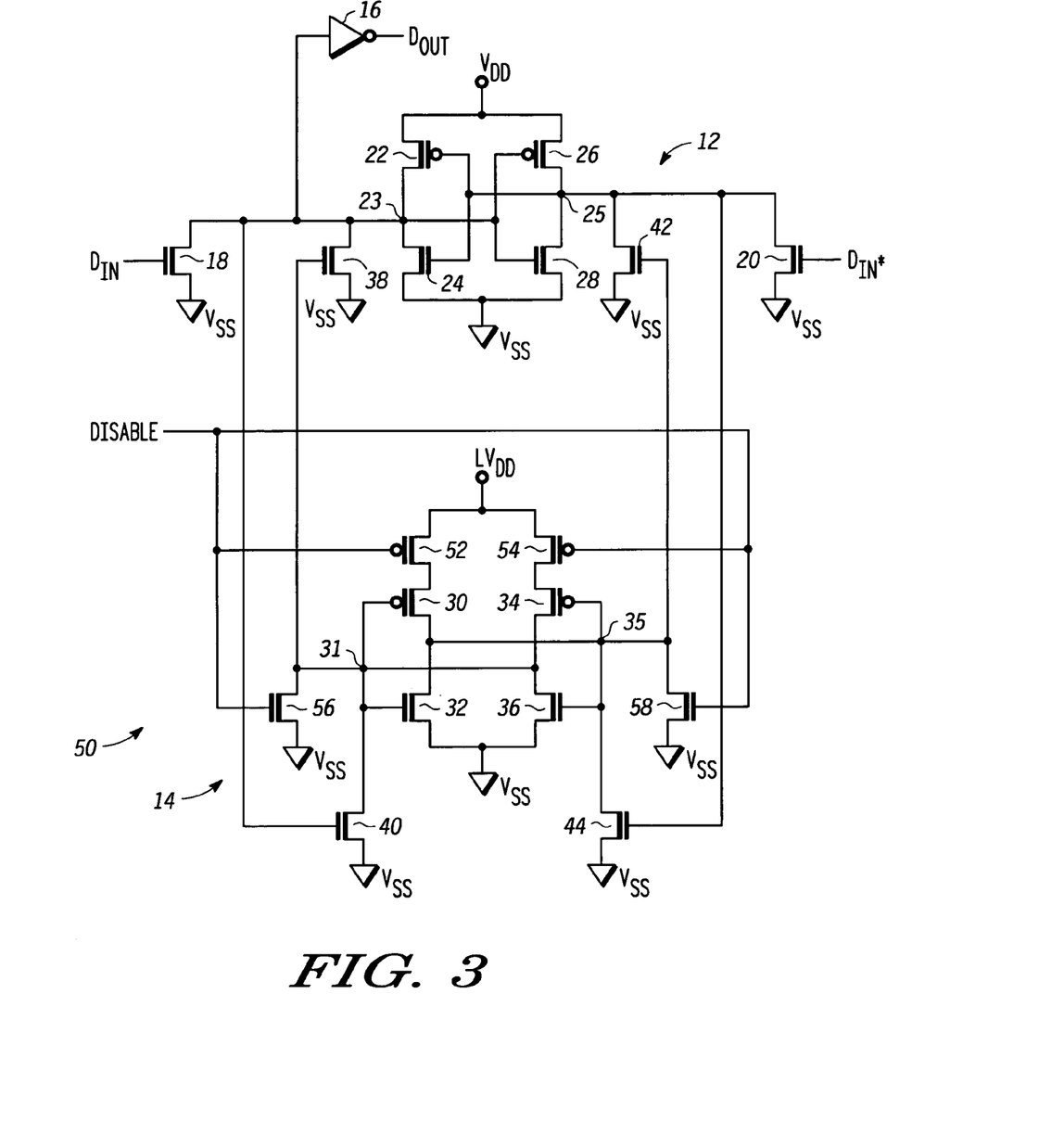
FIG. 3 illustrates, in schematic diagram form, an integrated circuit storage element in accordance with another embodiment of the present invention.

FIG. 3 illustrates, in schematic diagram form, an integrated circuit storage element 50 in accordance with another embodiment of the present invention. Note that for the purpose of clarity and brevity, like or similar elements in FIG. 1 and FIG. 3 have the same reference numbers. Storage element 50 is different from storage element 10 in that latch 14 includes additional P-channel transistors 52 and 54 and additional N-channel transistors 56 and 58. The additional transistors are optional and function to disconnect $LV_{DD}$ from latch 14 and to cause nodes 31 and 35 to be coupled to $V_{SS}$ in response to a disable signal labeled "DISABLE" being asserted as a logic high voltage. P-channel transistors 52 and 54 each have their sources connected to $LV_{DD}$, their gates coupled to receive signal DISABLE, and their drains connected to the sources of transistors 30 and 34. N-channel transistors 56 and 58 are coupled in parallel with transistors 32 and 36, respectively. The gates of N-channel transistors 56 and 58 are coupled to receive signal DISABLE.

In operation, during normal mode, storage element 50 functions similarly to storage element 10, except that signal DISABLE and transistors 52, 54, 56, and 58 are shown as one way to disconnect the power supply voltage from $LV_{DD}$. When storage element 50 is operating in normal mode, signal DISABLE is asserted as a logic high and transistors 56 and 58 are conductive and transistors 52 and 54 are substantially non-conductive. This causes $LV_{DD}$ to be disconnected from the sources of transistors 30 and 34 and causes nodes 31 and 35 of latch 14 to be at ground potential. During low power mode, signal DISABLE is asserted as a logic low, causing transistors 52 and 54 to be conductive, and coupling $LV_{DD}$ to the sources of transistors 30 and 34. Transistors 56 and 58 are substantially non-conductive, allowing the logic states of nodes 23 and 25 of latch 12 to change the logic states of nodes 31 and 35 of latch 14.

Figure 4:
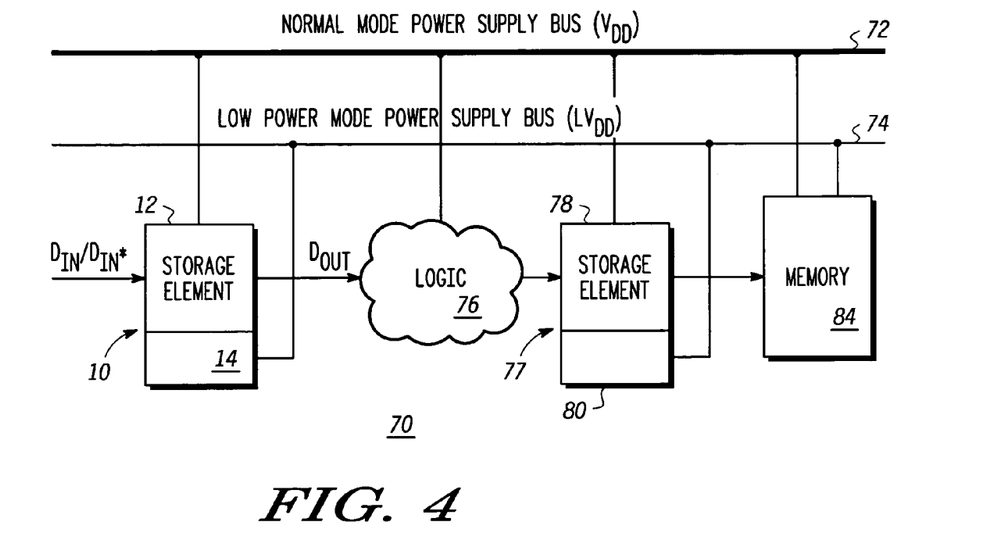
FIG. 4 illustrates, in block diagram form, a portion of an integrated circuit in accordance with an embodiment of the present invention.

FIG. 4 illustrates, in block diagram form, a portion of an integrated circuit 70 in accordance with an embodiment of the present invention. Integrated circuit 70 may be, for example, a microprocessor, or memory, or any type of integrated circuit that has a normal operating mode and a low power operating mode. Integrated circuit 70 includes a normal mode power supply bus 72 and a low power mode power supply bus 74. The storage element 10, illustrated in FIG. 1, is coupled to both power supply buses 72 and 74 for receiving power a supply voltage $V_{DD}$ and power supply voltage $LV_{DD}$. The power supply voltage $V_{DD}$ is a normal power supply voltage that is applied to the integrated circuit during normal circuit operation. The power supply voltage $LV_{DD}$ is a power supply voltage provided to certain logic or storage elements of integrated circuit 70 that are necessary for preserving a state of integrated circuit 70 during a low power mode, such as for example, a "sleep" mode. In one embodiment, the power supply buses 72 and 74 are laid out on integrated circuit 70 as metal conductors. The power supply bus 72 may be part of a power supply grid that provides $V_{DD}$ to circuits all over the integrated circuit 70. The power supply bus 74 provides $LV_{DD}$ to only those parts of integrated circuit 70 that require $LV_{DD}$ during a low power mode and is therefore relatively more lightly loaded than power supply bus 72.

A logic block 76 is coupled to normal mode power supply bus 72 for receiving power supply voltage $V_{DD}$. The logic block 76 illustrates various circuits in integrated circuit 70 that are powered during the normal operating mode but are not powered during the low power mode. The logic block 76 is coupled to receive data signals $D_{OUT}$ from storage element 10 and to provide signals to a storage element 77.

Storage elements 10 and 77 are representative of a plurality of storage elements in integrated circuit 70 that store information such as data, control, address and other signals necessary during normal operation. Also, the information stored by the plurality of storage elements represented by storage elements 10 and 77 must be retained during a low power mode in order for the integrated circuit 70 to operate properly when returning to a normal operating mode. Storage element 77 includes a first portion 78 and a second portion 80. The first portion 78 is powered by $V_{DD}$ and operates during a normal operating mode. The second portion 80 is powered by power supply bus 74. Storage element 77 may be the same as storage element 10 as illustrated in FIG. 1 or FIG. 3, or storage element 77 may be a different type of storage device having a latch is that only used during normal mode, and a latch that is only used during low power mode.

Latch 77 is coupled to receive signals from logic 76 and provides signals to a memory 84. Memory 84 may be any type of random access memory, such as for example, a static random access memory (SRAM), a dynamic random access memory (DRAM), or a non-volatile memory such as flash. Memory 84 is coupled to power supply bus 72 and may optionally be coupled to power supply bus 74 so that memory 84 may operate in low power mode if necessary.

By selectively providing a lower power supply voltage ($LV_{DD}$) to certain storage elements of an integrated circuit during a low power mode, the normal power supply voltage ($V_{DD}$) may be turned off. The lower power supply voltage $LV_{pp}$ is high enough to allow the storage elements to retain their states and low enough that leakage current is minimized. During a normal operating mode, the low power supply voltage can be turned off. Note that in other embodiments, additional low power mode power supply buses $LV_{pp}$ may be implemented. Also, the additional low power mode power supply buses may provide different voltages as described below.

Figure 5:
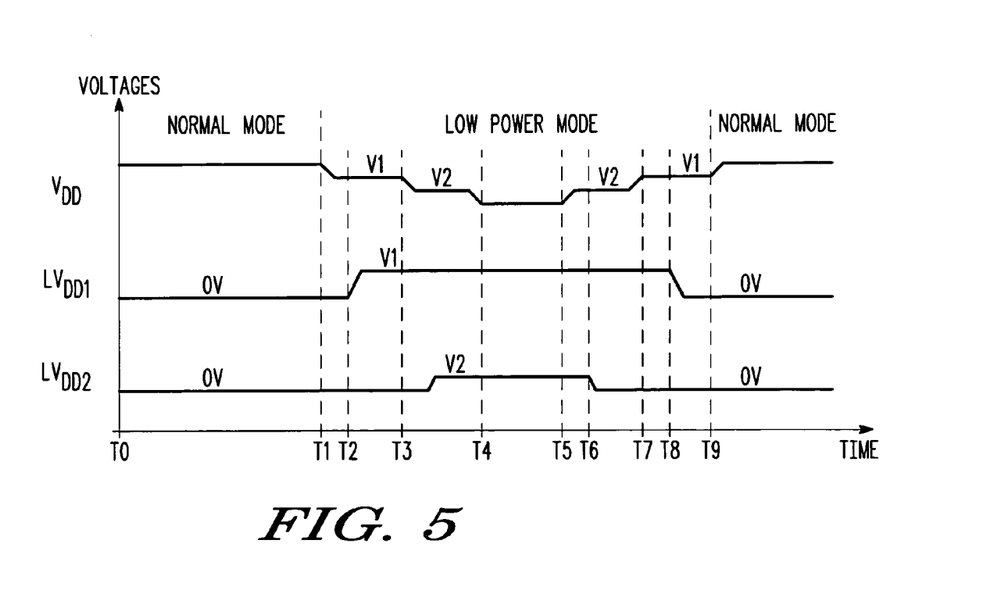
FIG. 5 illustrates a timing diagram of various supply voltages is accordance with another embodiment of the present invention.

At present, an integrated circuit may include various circuit modules that cooperate to perform a function that once required several integrated circuits. The modules of a "system-on-a-chip" (SOC) integrated circuit may include circuits that are implemented with different transistor types that display different leakage characteristics. FIG. 5 illustrates a timing diagram of various supply voltages is accordance with another embodiment of the present invention that may be used on a SOC type of application.

In FIG. 5, a voltage labeled $V_{DD}$ is a normal power supply voltage for the SOC. The power supply voltage $V_{DD}$ may be, for example, 1.2 volts. A voltage labeled $LV_{DD1}$ is a lower power supply voltage that is provided to a module that requires, for example, 0.7 volts during a low power mode. A voltage labeled $LV_{DD2}$ is another lower power supply voltage that is provided to a different module that requires, for example, 0.6 volts during a low power mode. If storage element 10 (FIG. 1) is implemented in a first module that requires $LV_{DD1}$, then a latch 14 in the first module would be powered by $LV_{DD1}$ and a latch 12 in the first module would be powered by $V_{DD}$. Likewise, if storage element 10 is implemented in a second module that requires $LV_{DD2}$ during low power mode, then latch 14 in the second module would be powered by $LV_{DD2}$.

For the SOC example above, during a normal mode of operation as indicated in FIG. 5 between times T0 and T1, $V_{DD}$ is provided to the SOC and $LV_{DD1}$ and $LV_{DD2}$ are at zero volts. Note that the voltages presented are for discussion purposes only and may be different in other embodiments.

At time T1, a low power mode, such as sleep mode, is entered and $V_{DD}$ transitions to an intermediate voltage labeled V1, where voltage V1 is equal to approximately the voltage of $LV_{DD1}$. At time T2, $LV_{DD1}$ rises to voltage V1 and the logic state of a latch 12 is transferred to a latch 14 while both $V_{DD}$ and $LV_{DD1}$ are at V1. At time T3, $V_{DD}$ drops to a voltage V2, where voltage V2 is equal to approximately the voltage $LV_{DD2}$. The logic state of another latch 12 is transferred to another latch 14. At time T4, the voltage of $V_{DD}$ is reduced to zero volts and remains at zero volts until the integrated circuit is returned to a normal operating mode. At time T4, the transition to low power mode is complete. The states of the low power latches 14 are retained as discussed above in the discussion of FIG. 1.

While in the low power mode, there is very little or no leakage current from the circuits powered only by $V_{DD}$ because $V_{DD}$ has been reduced to zero voltage. The only leakage current is from the circuits powered by $LV_{DD1}$ and $LV_{DD2}$, but because $LV_{DD1}$ and $LV_{DD2}$ are provided at a lower voltage than $V_{DD}$, the leakage current is minimized. As discussed above in the description of FIG. 1, because latch 14 of storage element 10 is not in a critical speed path of the integrated circuit, the transistors may be implemented to have a higher threshold voltage, thus reducing leakage current even further.

At time T5, the normal operating mode is re-entered and $V_{DD}$ begins to ramp up to voltage V2. The logic state of latch 14 of the second module is transferred to latch 12 of the second module while $V_{DD}$ and $LV_{DD2}$ are about equal. At time T6, $LV_{DD2}$ is reduced to zero volts. At time T7, $V_{DD}$ increases to voltage V1 and the logic state of latch 14 of the first module is transferred to latch 12 of the first module while $V_{DD1}$ and $LV_{DD1}$ are approximately equal. At time T8, $LV_{DD1}$ is reduced to zero volts. At time T8, the voltage of $V_{DD}$ increases to the normal operating voltage and a normal operating mode is resumed.

While the invention has been described in the context of a preferred embodiment, it will be apparent to those skilled in the art that the present invention may be modified in numerous ways and may assume many embodiments other than that specifically set out and described above.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
    a first power supply bus for providing a first power supply voltage to a first plurality of circuit elements; and
    a second power supply bus for providing a second power supply voltage to a second plurality of circuit elements, the second power supply voltage being lower than the first power supply voltage;
    wherein the first power supply bus provides the first power supply voltage to the first plurality of circuit elements during a normal operating mode of the integrated circuit, and wherein the second power supply voltage is not provided to the second plurality of circuit elements during the normal operating mode of the integrated circuit,
    wherein the second power supply bus provides the second power supply voltage to the second plurality of circuit elements during a low power operating mode of the integrated circuit, and wherein the first power supply voltage is not provided to the first plurality of circuit elements during the low power operating mode of the integrated circuit; and
    wherein when the integrated circuit is transitioning from the normal operating mode to the low power operating mode the first and second power supply voltages are provided by the first and second power supply buses at the same time for a first predetermined length of time.

2. The integrated circuit of claim 1, wherein the first plurality of circuit elements comprises a first plurality of storage elements and the second plurality of circuit elements comprises a second plurality of storage elements, and wherein one of the first plurality of storage elements is coupled to a corresponding one of the second plurality of storage elements.

3. The integrated circuit of claim 2 wherein the first predetermined length of time is a length of time sufficient for a logic state of the one of the first plurality of storage elements to be transferred to the corresponding one of the second plurality of storage elements.

4. The integrated circuit of claim 3, wherein the logic state of the one of the first plurality of storage elements is transferred to the corresponding one of the second plurality of storage elements in response to the second power supply voltage being provided to the second plurality of storage elements.

5. The integrated circuit of claim 1 wherein first plurality of circuit elements comprises a plurality of logics circuits and the second plurality of circuit elements comprises a second plurality of storage elements.

6. The integrated circuit of claim 4, wherein the first power supply voltage is removed from the first plurality of storage elements at the end of the first predetermined length of time.

7. The integrated circuit of claim 6, wherein when the integrated circuit is transitioning from the low power operating mode to the normal operating mode, the first and second power supply voltages are provided by the first and second power supply buses for a second predetermined length of time.

8. The integrated circuit of claim 7 wherein the second predetermined length of time is a length of time sufficient for a logic state of the one of the second plurality of storage e elements to be transferred to the corresponding one of the first plurality of storage elements.

9. The integrated circuit of claim 2, wherein the one of the first plurality of storage elements comprising a first pair of cross-coupled inverters having first and second storage nodes, and the corresponding one of the second plurality of storage elements comprising a second pair of cross-coupled inverters having third and forth storage nodes; the integrated circuit further comprising: a first transistor having a first current electrode coupled to the first storage node, a second current electrode coupled to a ground terminal, and a control electrode coupled to the third storage node; and a second transistor having a first current electrode coupled to the third storage node, a second current electrode coupled to the ground terminal, and a control electrode coupled to the first storage node.

10. A method comprising:
    providing a first power supply bus on an integrated circuit for conducting a first power supply voltage to a first plurality of circuits;
    providing the first power supply voltage to the first plurality of circuits on the integrated circuit during a normal operating mode of the integrated circuit;
    removing the first power supply voltage from the first power supply bus during a low power operating mode;
    providing a second power supply bus on the integrated circuit for providing a second power supply voltage to a second plurality of circuits on the integrated circuit during the low power operating mode of the integrated circuit; and
    removing the second power supply voltage from the second power supply bus during the normal operating mode; and
    providing both the first power supply voltage and the second power supply voltage at the same time for a first predetermined time period when the integrated circuit transitions between the normal operating mode and the low power operating mode.

11. The method of claim 10, wherein the first plurality of circuits comprise logic circuits and the second plurality of circuits comprise storage elements.

12. The method of claim 10 further comprising providing both the first power supply voltage and the second power supply voltage for a second predetermined time period when the integrated circuit transitions from the low power operating mode to the normal operating mode.

13. The method of claim 12, further comprising transferring data between one of the second plurality of circuits to one of the first plurality of circuits during the first predetermined time period.

14. The method of claim 10, further comprising transferring data between one of the first plurality of circuits to one of the second plurality of circuits during the first predetermined time period.

15. The method of claim 10, wherein providing both the first power supply voltage and the second power supply voltage for a first predetermined time period further comprises automatically transferring data between one of the first plurality of circuits to one of the second plurality of circuits in response to providing both the first and second power supply voltages.

16. The method of claim 10, wherein the first plurality of circuits comprises a first plurality of storage elements and the second plurality of circuits comprises a second plurality of storage elements.

17. An integrated circuit having a normal operating mode and a low power mode, the integrated circuit comprising:

a first latch circuit having an input terminal for receiving a data signal, a power supply terminal for receiving a first power supply voltage, and an output terminal; and a second latch circuit having an input terminal coupled to the output terminal of the first latch circuit, a power supply terminal for receiving a second power supply voltage different from the first power supply voltage, and an output terminal coupled to the input terminal of the first latch circuit;

wherein during the normal operating mode the first power supply voltage is provided to the first latch circuit and the second power supply voltage is not provided to the second latch circuit;

wherein during the low power mode the second power supply voltage is provided to the second latch circuit and the first power supply voltage is not provided to the first latch circuit; and wherein when the integrated circuit is transitioning from the normal operating mode to the low power mode the second power supply voltage is provided to the second latch circuit and the first power supply voltage is provided to the first latch circuit at the same time for a first predetermined length of time and then the first power supply voltage is removed from the first latch circuit, the first predetermined length of time sufficient for a logic state of the first latch circuit to be transferred to the second latch circuit.

18. The integrated circuit of claim 17, wherein the first and second latch circuits each comprise a pair of cross-coupled inverters having first and second storage nodes, the integrated circuit further comprising: a first transistor having a first current electrode coupled to the first storage node of the first latch circuit, a second current electrode coupled to a ground terminal, and a control electrode coupled to the first storage node of the second latch circuit; and a second transistor having a first current electrode coupled to the first current electrode of the second latch circuit, a second current electrode coupled to the ground terminal, and a control electrode coupled to the first storage node of the first latch circuit.

19. The integrated circuit of claim 17, wherein the second power supply voltage is lower than the first power supply voltage.

20. The integrated circuit of claim 17, wherein when the integrated circuit is transitioning from the low power mode to the normal operating mode the second power supply voltage is provided to the second latch circuit and the first power supply voltage is provided to the first latch circuit at the same time for a second predetermined length of time and then the second power supply voltage is removed from the second latch circuit, the second predetermined length of time sufficient for a logic state of the second latch circuit to be transferred to the first latch circuit.

* * * * *

UNITED STATES PATENT AND TRADEMARK OFFICE
CERTIFICATE OF CORRECTION

| | |
|---|---|
| PATENT NO. | : 7,215,188 B2 |
| APPLICATION NO. | : 11/065796 |
| DATED | : May 8, 2007 |
| INVENTOR(S) | : Ravindraraj Ramaraju |

Page 1 of 1

It is certified that error appears in the above-identified patent and that said Letters Patent is hereby corrected as shown below:

In Column 7, Line 64, Claim No. 8:

Change "the second plurality of storage e" to --the second plurality of storage--

Signed and Sealed this

Twenty-seventh Day of May, 2008

JON W. DUDAS
*Director of the United States Patent and Trademark Office*